United States Patent
Yi

(10) Patent No.: US 7,195,808 B2
(45) Date of Patent: Mar. 27, 2007

(54) SYSTEM AND METHOD FOR IDENTIFYING SUBSTRATE SIDE

(75) Inventor: Chang Bok Yi, Fremont, CA (US)

(73) Assignee: Seagate Technology, LLC, Scotts Valley, CA (US)

( * ) Notice: Subject to any disclaimer, the term of this patent is extended or adjusted under 35 U.S.C. 154(b) by 263 days.

(21) Appl. No.: 10/674,946

(22) Filed: Sep. 29, 2003

(65) Prior Publication Data

US 2004/0115387 A1    Jun. 17, 2004

Related U.S. Application Data

(60) Provisional application No. 60/414,986, filed on Sep. 30, 2002.

(51) Int. Cl.
*G11B 5/66* (2006.01)
*G11B 5/70* (2006.01)

(52) U.S. Cl. .................. 428/66.5; 428/848.5; 360/135

(58) Field of Classification Search ................ 428/826, 428/827, 846, 848, 848.1, 848.5, 848.6, 66.5; 360/135
See application file for complete search history.

(56) References Cited

U.S. PATENT DOCUMENTS 6,567,240 B2 * 5/2003 Baumgartner et al. ...... 360/135

* cited by examiner

*Primary Examiner*—Holly Rickman
(74) *Attorney, Agent, or Firm*—Morrison & Foerster LLP

(57) ABSTRACT

A system for marking the different sides of a substrate so that the different sides can be identified is disclosed. A substrate holder is used for marking a substrate during the film growth process so that the different sides of the substrate can be distinguished includes a set of fingers having a groove for holding the substrate. The fingers extend over a surface of the substrate for shielding incoming material being deposited onto the surface of the substrate leaving a portion of the surface uncovered. The fingers are positioned asymmetrically. The fingers include a first finger, a second finger, and a third finger, with a distance between said first finger and said second finger is less than the distance between said first finger and said third finger and is less than the distance between said second finger and said third finger.

6 Claims, 8 Drawing Sheets

FRONT SIDE VIEW

FRONT SIDE VIEW

BACK SIDE VIEW

SYSTEM AND METHOD FOR IDENTIFYING SUBSTRATE SIDE

CROSS REFERENCE TO RELATED APPLICATIONS

This application claims the benefit of U.S. Provisional Application No. 60/414,986, filed Sep. 30, 2002.

BACKGROUND OF THE INVENTION

1. Field of the Invention

The present invention relates generally to manufacturing processes involving the coating of substrates. More particularly, the present invention relates to apparatuses and methods for identifying a particular side of a substrate that is sputtered on both sides.

2. Description of the Related Art

Various manufacturing processes involve coating multiple layers of materials on substrates. Materials are coated onto substrates using various methods including but not limited to evaporation, chemical vapor deposition (CVD), plasma vapor deposition (PVD), and sputtering. A basic sputtering operation includes bombarding a target material with ions to release atoms from the surface of the target. The released atoms are directed towards the substrate so that they become deposited on the surface of the substrate. To build up the desired multiple layers of different materials, the sputtering operation is repeated with a previously coated substrate, using targets of different materials in each sputtering operation.

In some applications it is necessary or desirable to sputter identical layers onto both sides of the substrate. One application where it is necessary to deposit layers onto both sides of a substrate is magnetic media used in conventional hard disk drives for memory storage.

Conventional disk drives are used to magnetically record, store and retrieve digital data. Data is recorded to and retrieved from one or more disks that are rotated at more than one thousand revolutions per minute (rpm) by a motor. The data is recorded and retrieved from the disks by an array of vertically aligned read/write head assemblies, which are controllably moved from data track to data track by an actuator assembly.

The three major components making up a conventional hard disk drive are magnetic media, read/write head assemblies and motors. Magnetic media, which is used as a medium to magnetically store digital data, typically includes a layered structure, of which at least one of the layers is made of a magnetic material, such as CoCrPtB, having high coercivity and high remnant moment. The read/write head assemblies typically include a read sensor and a writing coil carried on an air bearing slider attached to an actuator. This slider acts in a cooperative hydrodynamic relationship with a thin layer of air dragged along by the spinning disks to fly the head assembly in a closely spaced relationship to the disk surface. The actuator is used to move the heads from track to track and is of the type usually referred to as a rotary voice coil actuator. A typical rotary voice coil actuator consists of a pivot shaft fixedly attached to the disk drive housing closely adjacent to the outer diameter of the disks. Motors, which are used to spin the magnetic media at rates of higher than 10,000 revolutions per minute (rpm), typically include brushless direct current (DC) motors. The structure of disk drives is well known.

Magnetic media is typically made by depositing multiple layers onto both sides of a substrate. By depositing a multi-layer magnetic media structure onto both sides of the substrate, twice as much information can be recorded onto each disk because both sides of the disks are used. Typically, two read/write heads are used when both sides of the magnetic media are utilized. Each side of the disk has its own read/write head to record and retrieve information from their respective sides.

FIG. 1A illustrates a conventional magnetic media structure comprising a substrate 110, a first nickel-phosphorous (NiP) layer 115, a second nickel-phosphorous (NiP) layer 116, a first seed layer 120, a second seed layer 121, a first magnetic layer 125, a second magnetic layer 126, a first protective layer 130 and a second protective layer 131. The substrate 110 is typically made of aluminum or high quality glass having few defects. The first nickel-phosphorous (NiP) layer 115 and second nickel-phosphorous (NiP) layer 116 are amorphous layers that are usually electrolessly plated or sputtered onto both sides of substrate 110. The NiP layers are used to enhance both the mechanical performance and magnetic properties of the disk. The NiP layers enhance the mechanical properties of the disk by providing a hard surface on which to texture. The magnetic properties are enhanced by providing a textured surface that improves the magnetic properties including the orientation ratio (OR).

First seed layer 120 and second seed layer 121 are typically thin films made of chromium that are deposited onto the NiP layers 115 and 116 respectively forming the foundation for structures that are deposited on top of them. First magnetic layer 125 and second magnetic layer 126, which are deposited on top of first seed layer 120 and second seed layer 121 respectively, typically include a stack of several magnetic and non-magnetic layers. The magnetic layers are typically made out of magnetic alloys containing cobalt (Co), platinum (Pt) and chromium (Cr), whereas the non-magnetic layers are typically made out of metallic non-magnetic materials. Finally, first protective overcoat 130 and second protective overcoat 131 are thin films typically made of carbon and hydrogen, which are deposited on top of the first magnetic layer 125 and second magnetic layer 126 respectively, using conventional thin film deposition techniques.

The magnetic media structure described with reference to FIG. 1A is usually constructed using conventional thin film deposition techniques such as sputter deposition. When a single disk sputtering process is used, a single substrate is usually processed in a sputtering system by moving the substrate in front of a target and sputter depositing a layer of material onto the substrate. The substrate is usually supported with a holder that has minimal contact on the substrate such as the one illustrated in FIG. 1B. The substrate holder of FIG. 1B supports a substrate with three support rods 160, 165 and 170 that make contact with the disk on the edge of the disk. This support structure is used because the surface of the disk is minimally affected allowing for the entire surface to be used for recording data.

In many applications, including the magnetic disk described with reference to FIG. 1A above, it is advantageous to distinguish between the two sides of the disk. Typically, one side is referred to as the A-side of the disk whereas the other side is referred to as the B-side of the disk. This is especially true in areas of media manufacturing because both sides of the disk are processed. Once a disk is processed it is very difficult to distinguish one side from the other side without maintaining side integrity throughout the process. Maintaining side integrity is not a reliable method of determining the sides of the disks because it is very difficult, if not impossible, to know if side integrity has been maintained throughout the process because typical processing step often involve many steps where the disks are removed from their cassettes and processed before returning the disks back into their cassettes.

There are many reasons why it is important to know which side of the disk is the A-side and which side of the disk is the B-side including failure analysis and quality control. Failure analysis work often requires an engineer to determine-which side of the disk is defective so that the engineer can timely find the problem causing the defect. Quality control also requires one to know which side of the disk has a defect because it insures quick notification to customers of which side of a disk they should use.

Therefore what is needed is a system and method that allows for reliable and quick identification of the disk side at different stages in the manufacturing process.

SUMMARY OF THE INVENTION

The invention provides a system and method for identifying a specific side of a substrate after both sides of the substrate have been coated with a layer of material.

One embodiment of the invention includes identifying a specific side of a substrate after both sides of the substrate have been covered with a magnetic layer. Identification marks are put on the substrate during the deposition process by masking the substrate so that the entire surface is coated with the sputtered material except for the portion of the substrate that is masked. The identification marks left on the substrate after depositing a layer of material on the substrate are identical on both sides of the substrate but are asymmetrically positioned relative to each other allowing for side identification at various points in the processing of the disk as well as after it has been finished.

In one embodiment of the invention, both sides of the disk are marked with an identical identification mark. The identification mark comprises three marks that are positioned so that two of the three marks are close together and the third mark is further apart. The marks are positioned so that their relative positions are identical on both sides of a disk. With these marks one is able to distinguish between the two sides of the substrate because one side will have the two close marks on the left side while looking directly at it while the other side will have the two closely spaced marks on the right side while looking directly at it.

The invention also includes a method of sputtering layers of materials onto both sides of a substrate so that the two sides can be distinguished. This method comprises the steps of positioning a mask that makes an identifying mark on either one side of a substrate or on both sides of the substrate.

A magnetic recording medium made by this sputter system and method is also disclosed. The magnetic recording medium made in accordance with the system and method disclosed includes a substrate for depositing layers thereon, a seed layer sputter deposited onto the substrate for defining the growth of subsequent layers, a magnetic layer sputter deposited onto the seed layer, and a protective overcoat sputter deposited onto the magnetic layer for protecting the magnetic layer.

A disk drive for recording and retrieving data using the magnetic recording medium made in accordance with this invention is also disclosed in this invention.

BRIEF DESCRIPTION OF THE INVENTION

DETAILED DESCRIPTION OF THE PREFERRED EMBODIMENTS

The invention provides a system and method for sputtering layers of material on both sides of a substrate such that the two sides are distinguishable. This invention has applications in many areas where thin films are deposited on both sides of a substrate. One area where this invention is applicable is the hard drive industry where magnetic media is typically constructed by depositing thin films on both sides of a substrate.

Figure 2A:
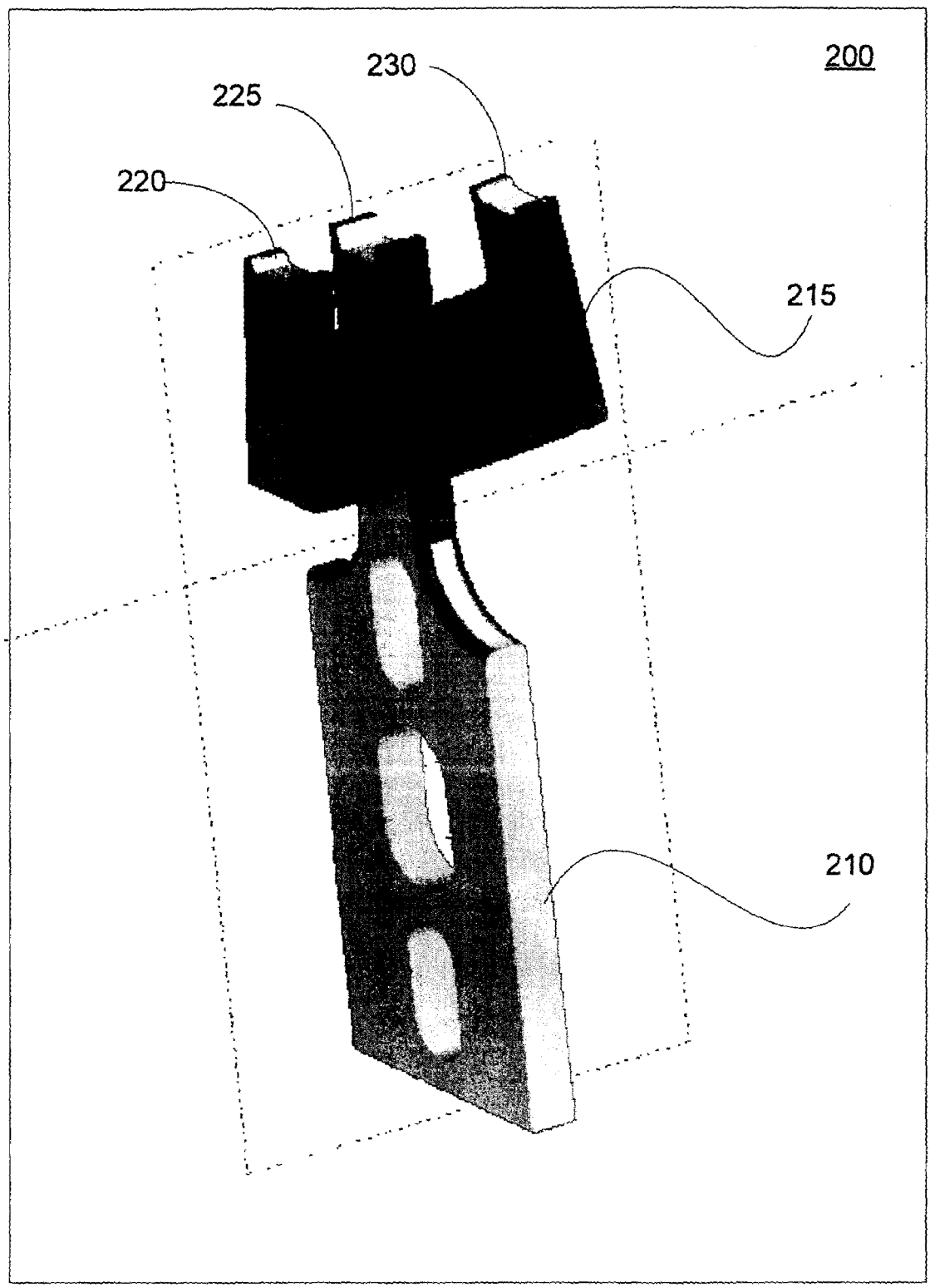
FIG. 2A is a block diagram illustrating an apparatus for putting identification marks on both sides of a substrate while depositing thin films on the substrate.
Figure 2B:
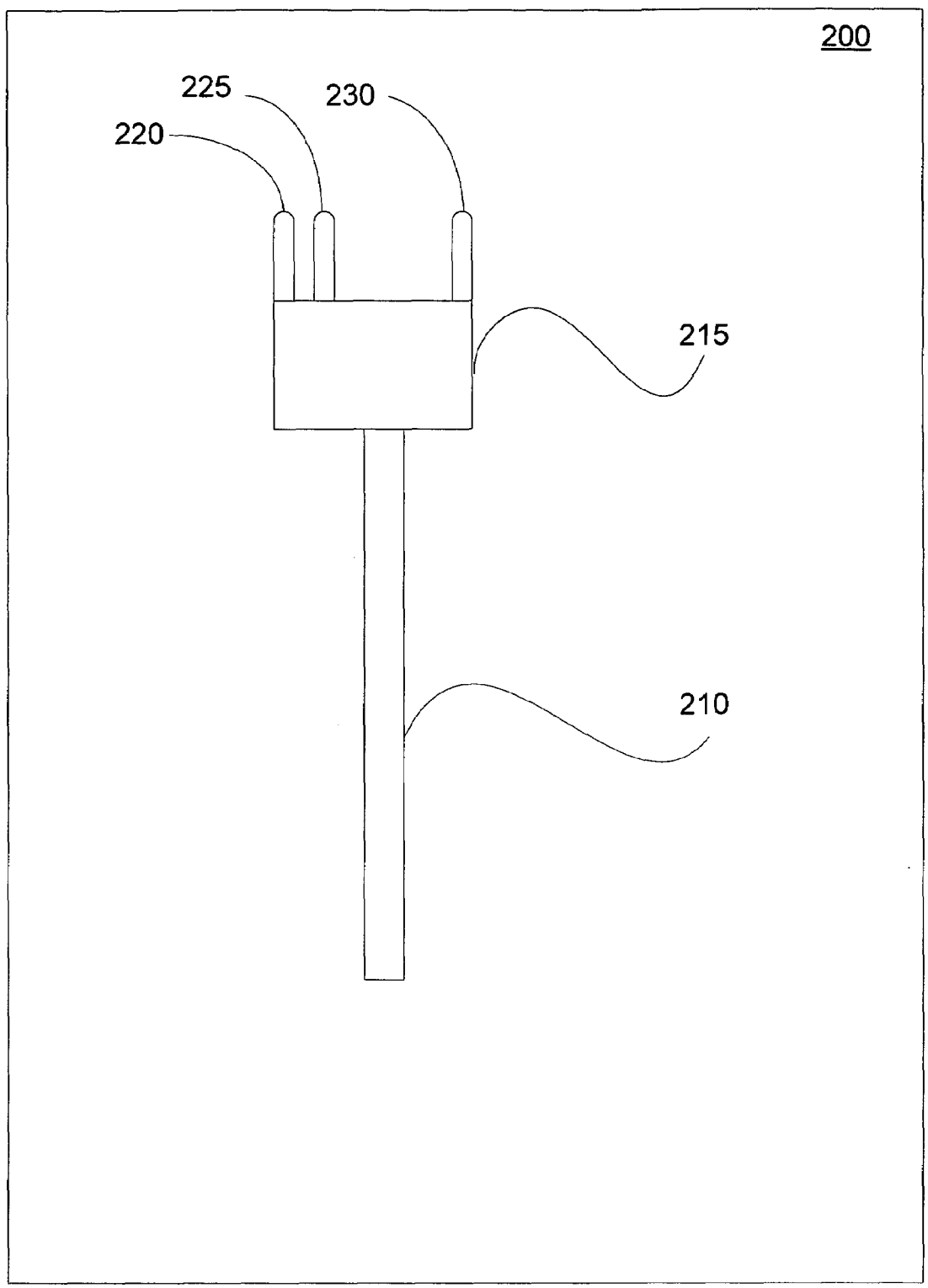
FIG. 2B is a block diagram illustrating a front view of the apparatus of FIG. 2A.

FIG. 2A is a diagram illustrating a Gripper/Marker 200 apparatus used for supporting a substrate and for putting identification marks on both sides of a substrate while depositing thin films on the substrate, in accordance with one embodiment of the invention. The Gripper/Marker 200 apparatus used to support the substrate and to put identification marks on both sides of the substrate is illustrated in FIG. 2A and includes a support bar 210 holding a pedestal 215 with a first finger 220, a second finger 225, and a third finger 230. The support bar 210 is made of a sturdy material such as stainless steel or aluminum which is both strong and vacuum compatible and is used to support the pedestal 215 which further supports a substrate as is further discussed with reference to FIG. 4A below. The pedestal 215 is also made of a sturdy material such as stainless steel or aluminum and is used to help support a substrate as is further discussed with reference to FIG. 4A below. The pedestal 215 has three indentation marks that act as a shield during the deposition process. The first finger 220, second finger 225 and third finger 230 are positioned on the pedestal so that they leave a pattern on both surface of the substrates near the outside diameter of the substrate. First finger 220 and second finger 225 are positioned on the pedestal 215 so that the distance between them is different than the distance between second finger 225 and third finger 230. The asymmetric positioning of the fingers creates a pattern on the disk, after depositing a layer onto the substrate, which permits for identification and distinction of the A and B sides of the disks. FIG. 2B is a block diagram illustrating a front view of the apparatus of FIG. 2A.

The three fingers act as masks leaving patterns on both surfaces of the substrates when films are deposited onto the substrates. The patterns generated on the substrate by the three fingers acting as a mask corresponds to the pattern of the three fingers on the pedestal 215.

In one embodiment of the invention the Gripper/Marker 200 apparatus is configured to support 95 mm substrates and to fit on a thin film deposition tool built by Intevac™ and referred to as the MDP™. Although detailed dimensions are given, it is understood that the invention is fully enabled for other dimensions as is understood by those skilled in the art. In this embodiment the Gripper/Marker 200 has a height of approximately between 0.20 inches and 0.4 inches and preferably 0.27 inches. The thickness of the Gripper/Marker 200 is between 0.20 inches and 0.30 inches and preferably 0.25 inches. The width of the Gripper/Marker 200 is between 0.05 inches and 0.07 inches and preferably 0.06 inches. The fingers are positioned asymmetrically so that the second finger 225 is positioned centrally along a centerline passing through the center of the support bar 210. The first finger 220 and second finger 230 are positioned so that their respective tip centers are located on lines that are rotated away from the centerline. The tip of the first finger 220 is located on a line that intersects the centerline at an angle of +7.5±0.5 degrees and a position of 1.87 inches above the tip of the second finger 225. The tip of the third finger 230 is located on a line that intersects the centerline at an angle of −5.5±0.5 degrees and a position of 1.87 inches above the tip of the second finger 225. Although very specific numerical ranges have been disclosed the invention is not limited to these values and one skilled in the art will recognize that these values can vary while not effecting the invention.

Figure 3:
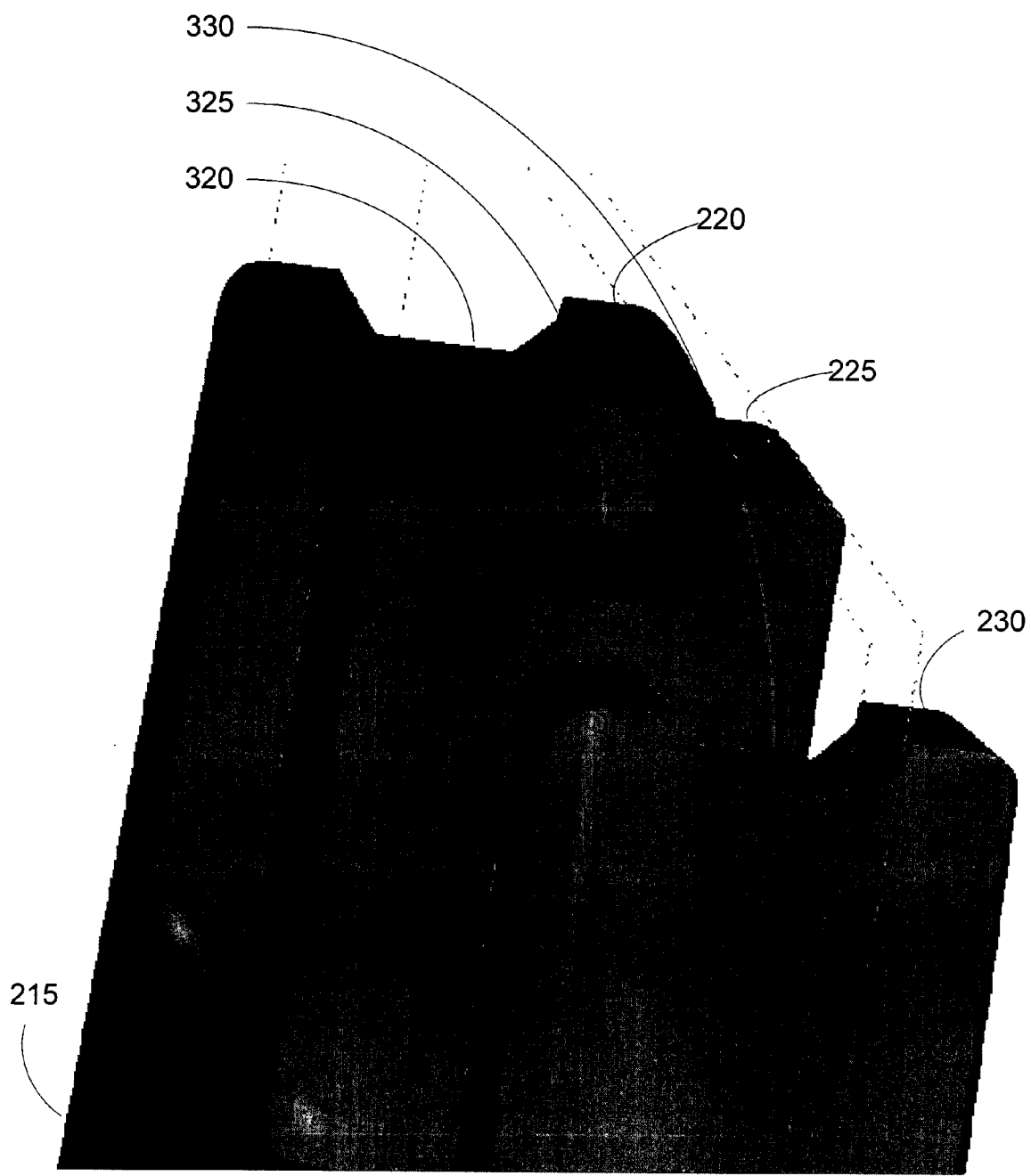
FIG. 3 is a diagram showing details of the apparatus of illustrated in FIG. 2A.

FIG. 3 is a diagram showing details of pedestal 215, first finger 220, second finger 225, and third finger 230. First slot 320, second slot 325 and third slot 330 are built into first finger 220, second finger 225 and third finger 230 respectively. First slot 320, second slot 325 and third slot 330 are each U-shaped grooves that fit around a substrate. Although this embodiment shows that the groves are made U-shaped, the grooves can be other shapes such as V-shaped. Since a substrate fits into the three slots and a layer of material is deposited onto the substrate while it is positioned on the three slots, the three fingers 220, 225 and 230 act as a mask, as is further discussed with reference to FIG. 4A below. The fingers act as masks because when a material is deposited onto the substrate, a layer is formed everywhere on the substrate except on the area of the substrate covered by the three fingers.

Figure 4A:
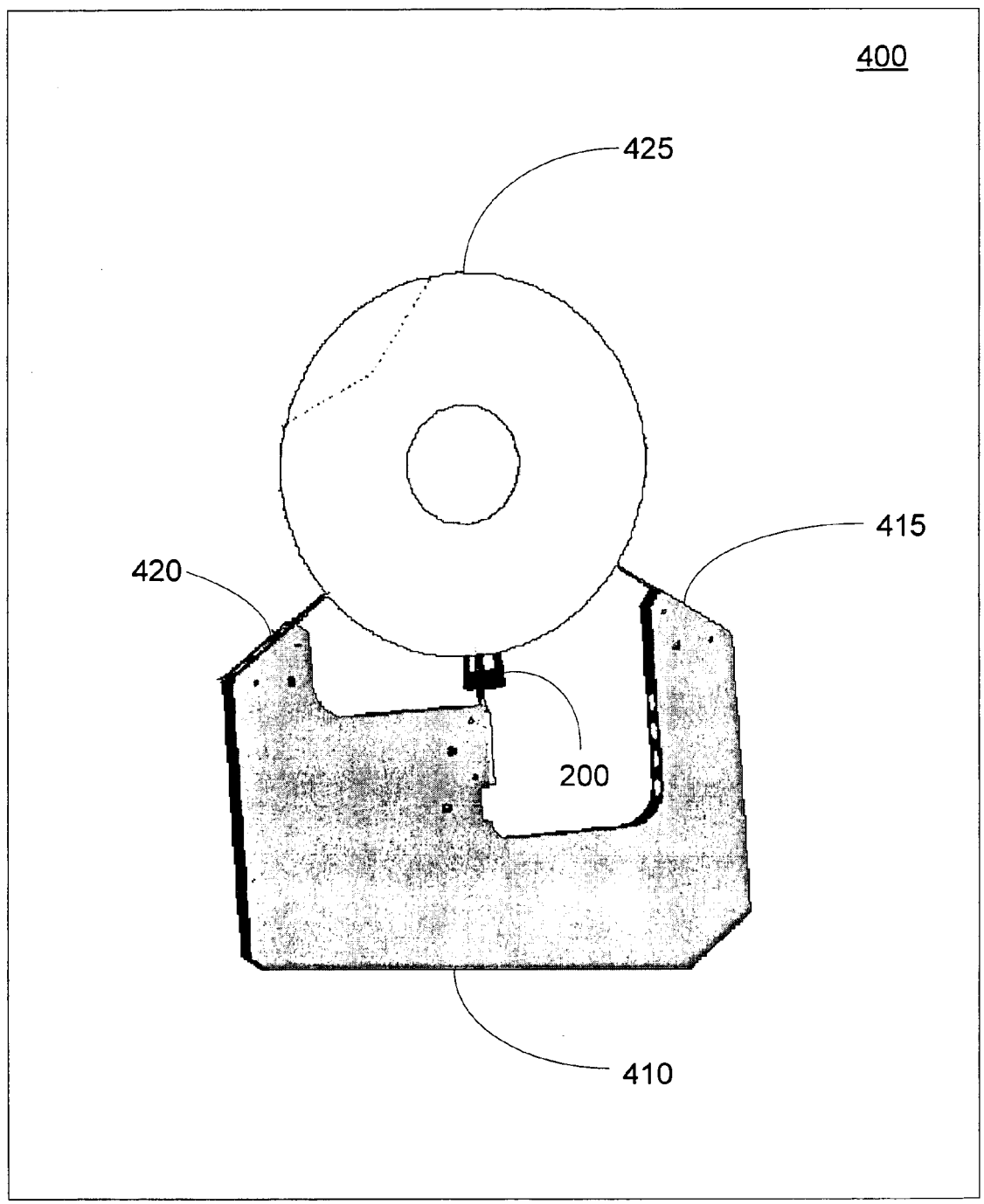
FIG. 4A is a diagram illustrating a substrate holder utilizing the three-finger pedestal of FIG. 2A and FIG. 3.

FIG. 4A is a diagram illustrating the three-finger pedestal of FIG. 2A and FIG. 3 mounted on a disk holder 400 holding a substrate 430 including a holder body 410, a first support rod 415, a second support rod 420, and the Gripper/Marker 200. During film deposition processes the substrate is usually supported in an upright position by first support rod 415, second support rod 420 and Gripper/Marker 200, so that both sides of the substrate can be coated with a layer of some material. The disk holder of FIG. 4A is typically mounted in a thin film deposition apparatus that processes one disk at a time. For example, the MDP™ series of sputtering tools built by Intevac™ typically processes one disk at a time and can comprise a disk holder equipped with a Gripper/Marker 200 as shown.

In such systems, the substrates are brought into a vacuum chamber having one set of targets and moved into the deposition position using the disk holder 400. The disks are usually transported into the vacuum chamber on a conveyer system and the disk holder is used to lift the substrate from the bottom and move the substrate into the correct position while the substrate is an upward position. Processing conditions are then obtained and the targets are fired off depositing a thin layer of the target material onto the substrate. The entire substrate is coated except for the portions that are masked with the three fingers of the pedestal. The disk is then lower back to the conveyer system where it is taken to the next vacuum station where it is similarly processed. The disk holder 400 can be equipped with the Gripper/Marker 200 in one or more chambers. For example if the objective is to detect a missing magnetic signal then the Gripper/Marker 200 only needs to be with substrate holders 400 located in chambers used to deposit magnetic layers.

Figure 1A:
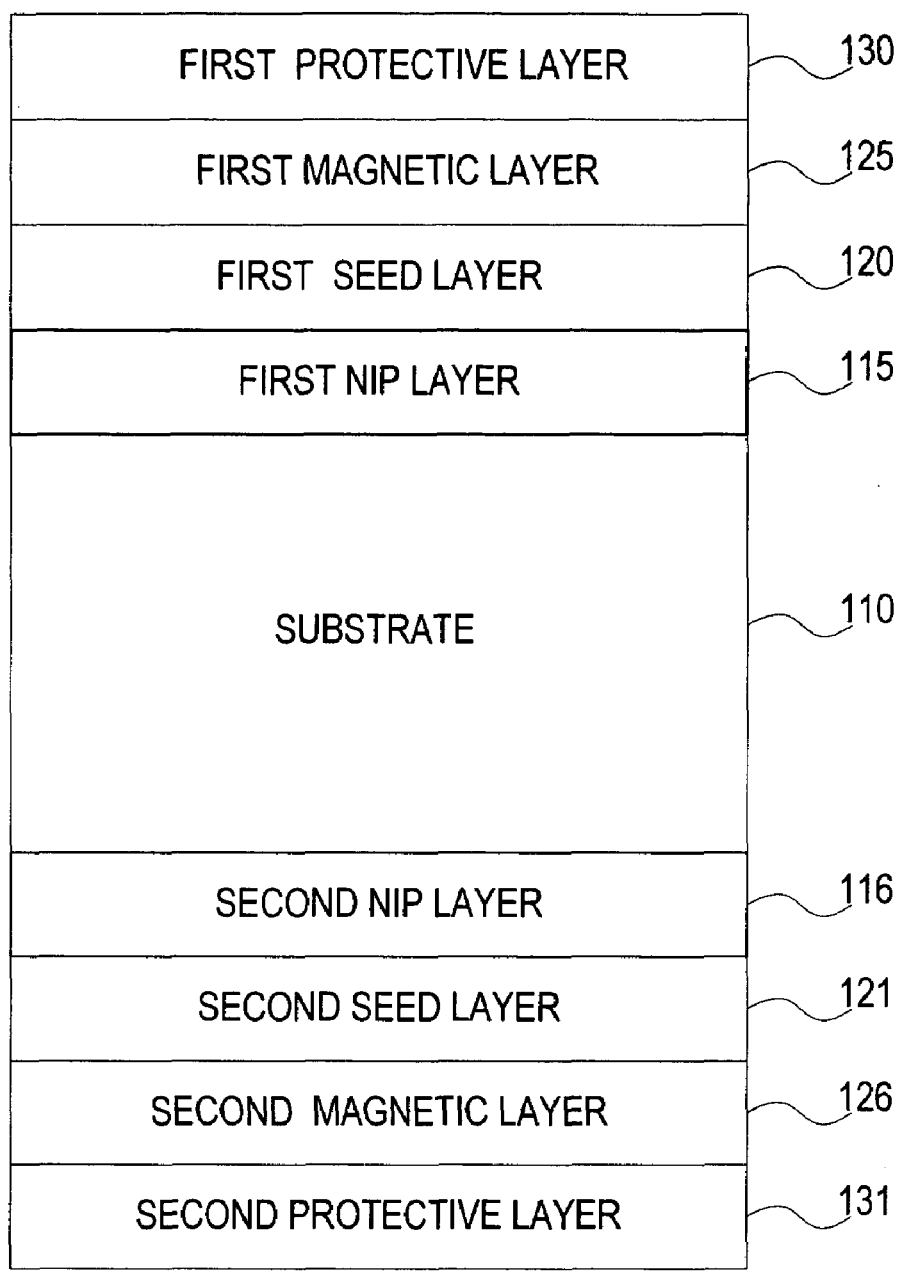
FIG. 1A is a block diagram showing a prior art conventional magnetic media structure.
Figure 1B:
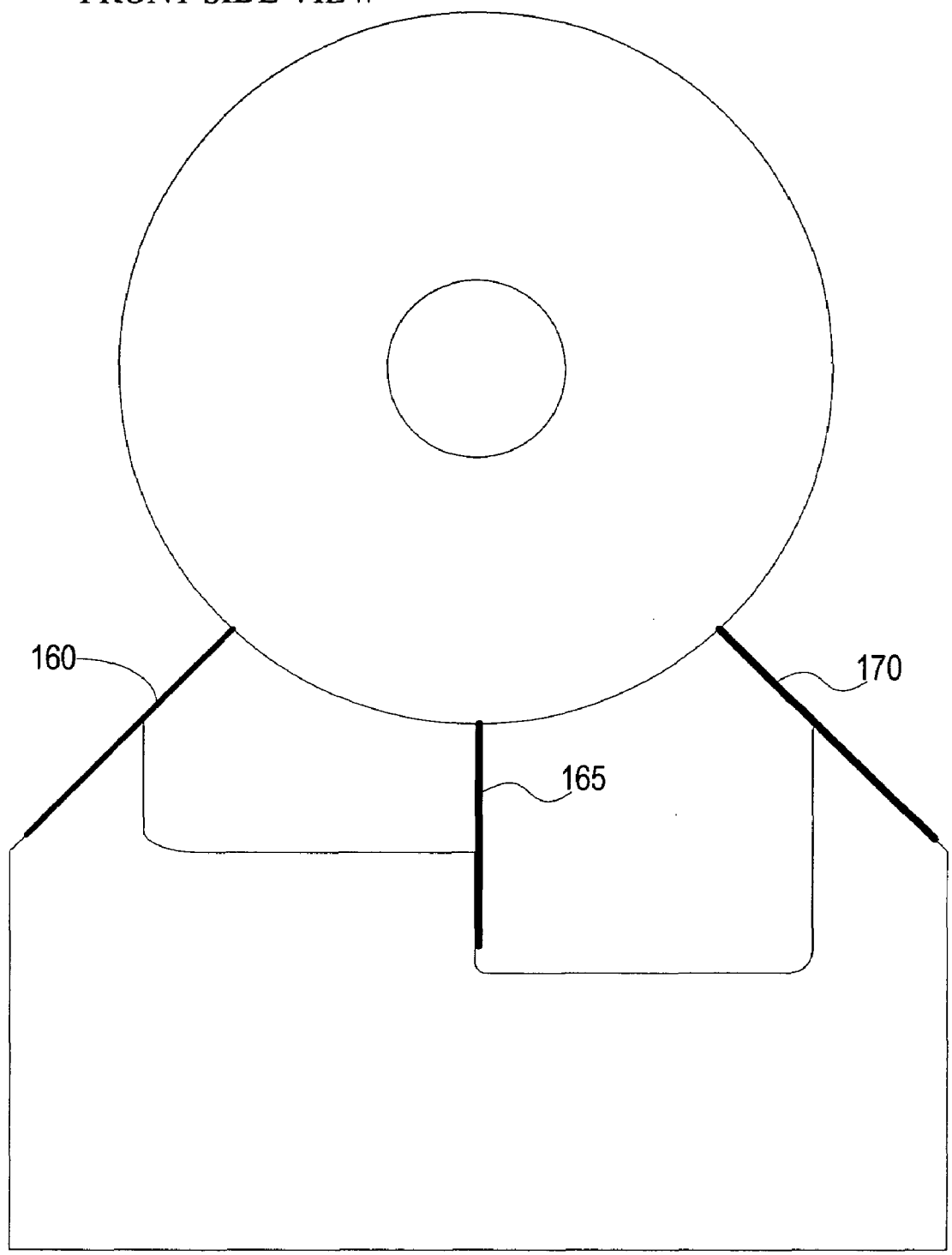
FIG. 1B is a block diagram showing a prior art conventional substrate holder used in a thin film deposition apparatus.

Although FIG. 4A shows the Gripper/Marker 200 located in the center supporting the disk and first support rod 415 and second support rod 420 are each located next to, and adjacent to, Gripper/Marker 200, other orientations are available. In other words, although FIG. 4A shows Gripper/Marker 200 replacing the center support rod 165 of FIG. 1B, Gripper/Marker 200 can be used to replace any of the support rods 160, 165 or 170 of the prior art shown in FIG. 1B. For example, the position of Gripper/Marker 200 can be interchanged with either the first support rod 415 or the second support rod 420. Moreover, Gripper/Marker can be positioned in such a way that it does not provide any support to the substrate and only acts as a means of masking the substrate during film deposition.

Figure 4B:
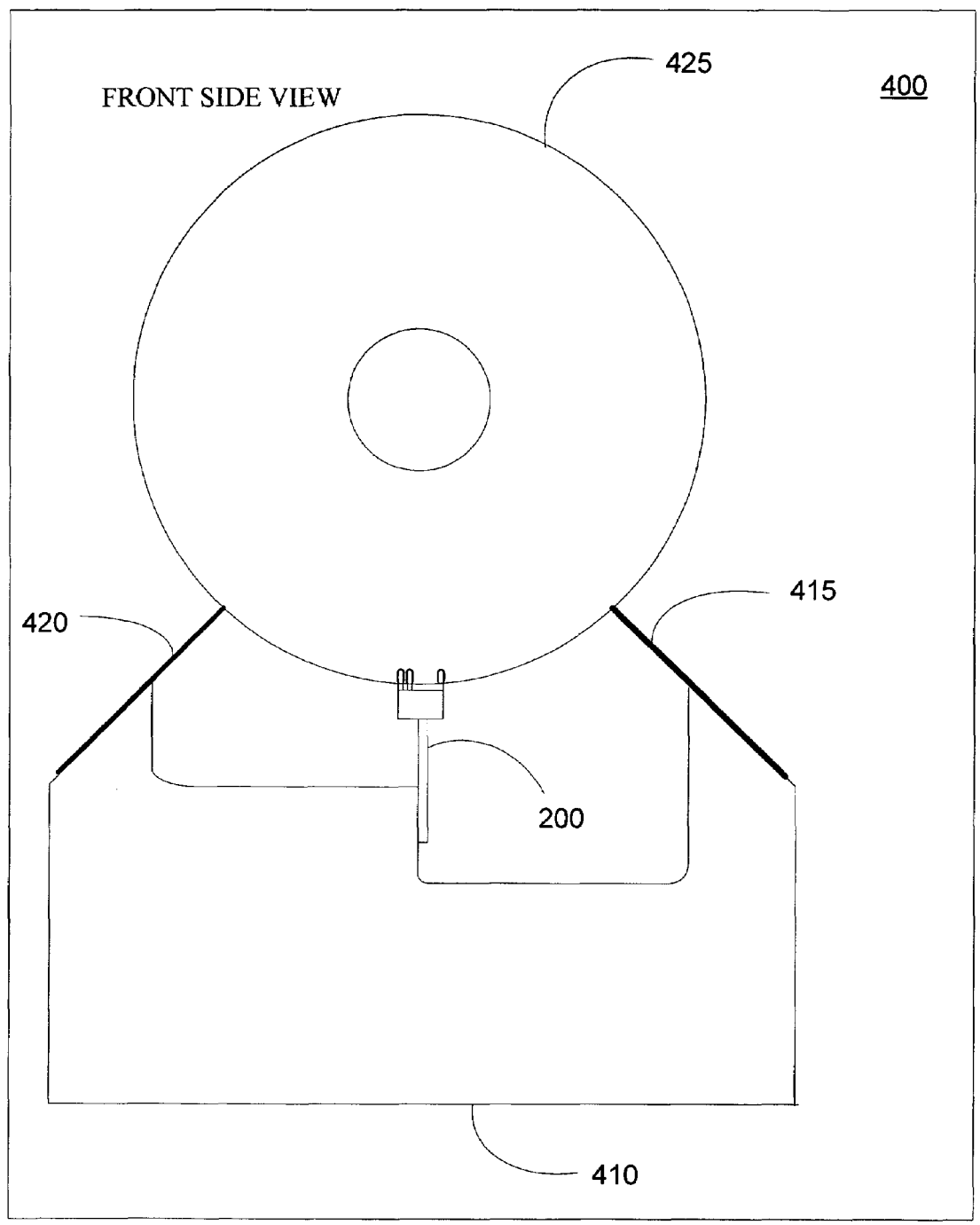
FIG. 4B is a block diagram illustrating a front view of the substrate holder of FIG. 4A.

FIG. 4B is a block diagram illustrating a front view of the substrate holder of FIG. 4A.

Figure 5A:
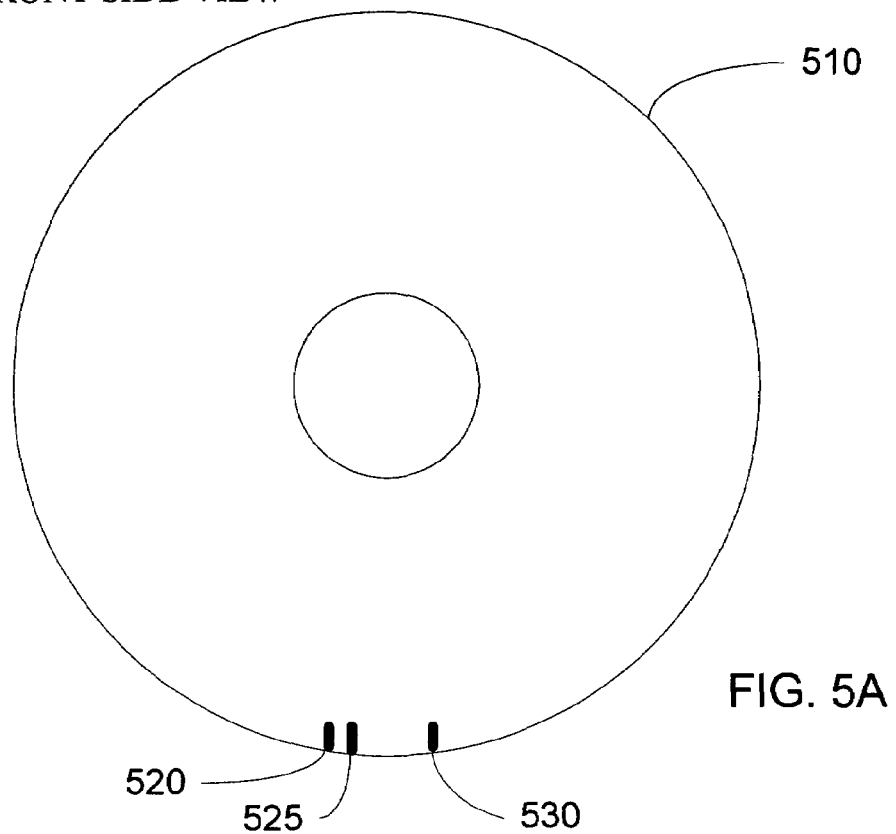
FIG. 5A is a front view of a substrate with identification marks generated with the apparatus of FIG. 2A.

FIG. 5A is a front view of a substrate having at least one layer deposited on it with identification marks generated using the apparatus of FIG. 2A, including a deposited substrate 510, a first identification mark 520, a second identification mark 525 and a third identification mark 530. First identification mark 520, second identification mark 525, and third identification mark 530 are positioned to match first finger 220, second finger 225 and third finger 230, respectfully. The identification marks are produced when a layer of a material is sputter deposited over the substrate while the substrate is supported in the apparatus of FIG. 4A and the substrate is masked with the fingers of the apparatus in FIG. 2A.

Figure 5B:
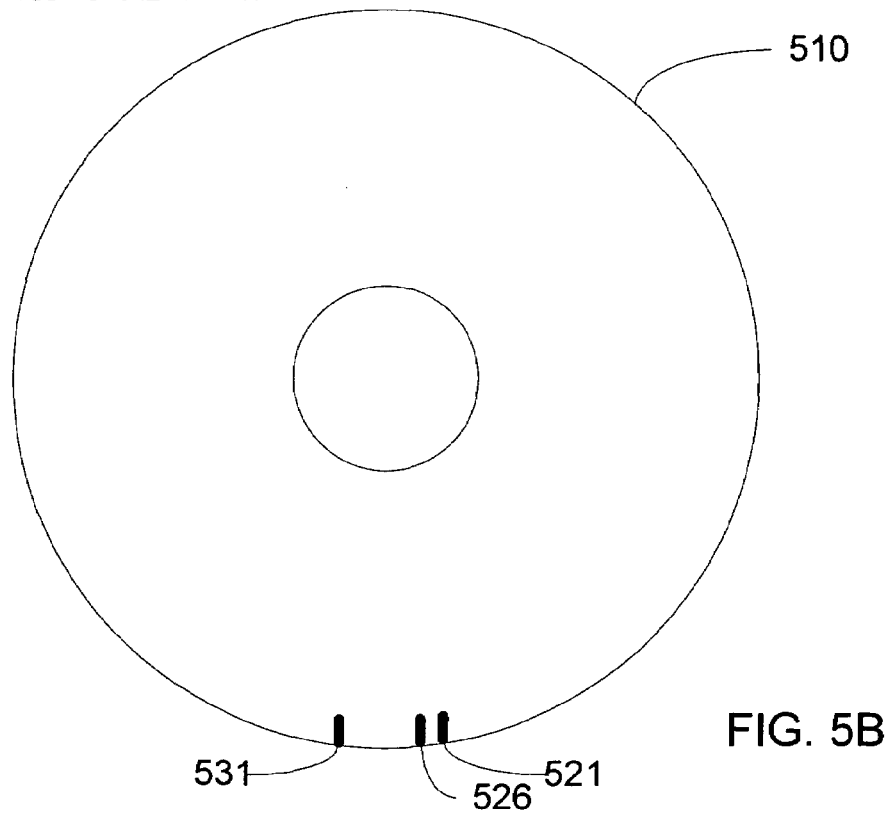
FIG. 5B is a back view of a substrate with identification marks generated with the apparatus of FIG. 2A.

Similarly, FIG. 5B is a back view of a substrate having at least one layer deposited on it with identification marks generated using the apparatus of FIG. 2A. FIG. 5B illustrates the B-side of deposited substrate 510 having a fourth identification mark 521, a fifth identification mark 526 and a fifth identification mark 531. In FIG. 5A, the identification marks that are located close together are on the left side as viewed face on whereas in FIG. 5B the close identification marks are on the right side as viewed face on.

Magnetic disks, which are used in hard drives, is one example of a substrate that has multiple films deposited on both sides and can benefit from the use of the Gripper/Marker 200 during its construction. Magnetic disks typically include a substrate with multiple layers deposited onto it, including one or more magnetic layers, as previously described with reference to FIG. 1 above. The magnetic layers are made of materials having a remnant moment so that information can be magnetically recorded onto the magnetic disk. Those skilled in the art will recognize that magnetic structures used for conventional media are comprised of multiple layers including a magnetic layer. When these layers are deposited onto the substrate making a magnetic disk the entire surface of the disk is covered except for the portion of the disk that is masked by the fingers. FIG. 5A shows the masked portions of the A-side of a disk labeled as 520, 525, and 530 whereas FIG. 5B shows the masked portions of the B-side of the disk labeled as 521, 526 and 531. The masked portion therefore has no magnetic material onto which information can be magnetically recorded. If the layers being deposited on the deposited substrate 510 are thick enough, then the portion of the disk without a layer can be seen with the naked eye. However, if the layers deposited onto disk 510 are thin then instrumentation must be used to detect the portions of the substrate that do not have any material on them. In one preferred embodiment the fingers are positioned so that two fingers are closer in distance to each other than the third finger. In FIG. 5A, first identification mark 520 and second identification mark 525 are closer together than third identification mark 530 on the A-side of the disk. Similarly in FIG. 5B, fourth identification mark 521 and fifth identification mark 526 are closer together than sixth identification mark 531. Therefore when layers are deposited onto the substrate there are corresponding portions that have missing material.

Once the magnetic disc has been made, it is placed into a tester where it is servo written and tested. Testers operate by spinning the disk in a specific orientation, and reading and writing to the disk as the disk is spun. Both sides of the disks are usually tested simultaneously in order to improve throughput. If the tester is set up to spin the disk in FIG. 5A in a clockwise rotation then the head reading the disk will first detect two missing magnetic signals spaced near to each other, then a normal magnetic disk and finally one missing signal spaced far apart. Similarly, the head located on the opposite side of the disk will detect the same signal configuration. However, if the magnetic disk is mounted with the reverse side facing up then the same tester will first detect one missing magnetic signal, then a normal magnetic disk and finally two missing magnetic signals spaced near to each other. With this pattern the tester can be programmed to identify which side it is testing.

By identifying which side of the substrate is being tested data can be gathered and associated with a particular side of disk. Once this data is gathered and associated with a disk, defects can be identified according to disk and side of disk. Process engineers can then use this data to assist in identifying where in the process the defect is occurring.

For example, if the fingers in FIG. 2A are arranged so that when the magnetic disk, which is made with this setup, is tested on a tester spinning the magnetic media clockwise the signature produced is two rapid blanks, a long wait, and then one blank when the A-side of the disk is inserted face up on the tester then the tester can determine where which side of the disk is face up. Therefore after the magnetic disk is mapped with the tester the data is associated to a particular side of a disk. If the tester reveals that there are too many identical defects occurring on just one side of a disk or multiple disks then one could conclude that there is something wrong in the manufacturing process where only one side is affected. For example, if the tester showed that the coercivity of only one side of a magnetic disk was decreasing but not the other side then this could be a warning that a target used to sputter one side of the disk was bad or perhaps being exhausted. This side-by-side information can be extremely valuable to a process engineer that is trying to identify the source of a defect.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A disk, comprising: a substrate having a first surface and a second surface for depositing a layer of material; a first layer deposited on the first surface and a second layer deposited on the second surface; a first set of identification marks located on the first surface of the substrate, said first set of identification marks having a first pattern with at least two marks closely spaced to each other and a third mark further spaced apart; and a second set of identification marks located on the second surface of the substrate, said second set of identification marks having a second pattern with at least two marks closely spaced to each other and a third mark further spaced apart, wherein the first set of identification marks are different from the second set of identification marks and the first and second sets of the identification marks lie on two different surfaces of the disk.

2. The disk of claim 1 wherein said first pattern is the same as said second pattern.

3. The disk of claim 1 wherein said first layer and said second layer are the same and are magnetic.

4. The disk of claim 1 wherein said first set of identification marks are regions on the first surface of the substrate that are void of said first layer material and said second set of identification marks are regions on the second surface of the substrate that are void of said second layer material.

5. The disk of claim 1 wherein: said first set of identification marks further includes a first identification mark, a second identification mark, and a third identification mark, with a distance between said first identification mark and said second identification mark is less than the distance between said first identification mark and said third identification mark and is less than the distance between said second identification mark and said third identification mark; and said second set of identification marks further includes a fourth identification mark, a fifth identification mark, and a sixth identification mark, with a distance between said fourth identification mark and said fifth identification mark is less than the distance between said fourth identification mark and said sixth identification mark and is less than the distance between said fifth identification mark and said sixth identification mark.

6. A hard drive for storing data, comprising: a disk of claim 1 for recording information; a motor for spinning the disk to access different portions of the disk; and a read/write head for recording and retrieving information from the disk.

* * * * *